United States Patent
Kaibara

(10) Patent No.: US 10,721,426 B2
(45) Date of Patent: Jul. 21, 2020

(54) SOLID-STATE IMAGE SENSOR, IMAGE CAPTURE APPARATUS AND IMAGE CAPTURE METHOD

(71) Applicant: CANON KABUSHIKI KAISHA, Tokyo (JP)

(72) Inventor: Hiroshi Kaibara, Hino (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 44 days.

(21) Appl. No.: 16/114,803

(22) Filed: Aug. 28, 2018

(65) Prior Publication Data
US 2019/0068909 A1  Feb. 28, 2019

(30) Foreign Application Priority Data
Aug. 31, 2017 (JP) ................................ 2017-167625
Jul. 17, 2018 (JP) ................................ 2018-134480

(51) Int. Cl.
| | |
|---|---|
| *H04N 5/376* | (2011.01) |
| *G02B 15/15* | (2006.01) |
| *G02B 7/10* | (2006.01) |
| *H04N 5/235* | (2006.01) |
| *H04N 5/369* | (2011.01) |

(Continued)

(52) U.S. Cl.
CPC .......... *H04N 5/3765* (2013.01); *G02B 7/102* (2013.01); *G02B 15/155* (2013.01); *H01L 27/1464* (2013.01); *H01L 27/14612* (2013.01); *H01L 27/14634* (2013.01); *H01L 27/14636* (2013.01); *H04N 5/2353* (2013.01); *H04N 5/232122* (2018.08); *H04N 5/343* (2013.01); *H04N 5/36961* (2018.08); *H04N 5/378* (2013.01)

(58) Field of Classification Search
CPC .......... H04N 5/232122; H04N 5/2353; H04N 5/343; H04N 5/36961; H04N 5/3765; H04N 5/378; H01L 27/14612; H01L 27/14634; H01L 27/14636; H01L 27/1464; G02B 15/155; G02B 7/102; G02B 7/285; G01S 11/12
See application file for complete search history.

(56) References Cited

U.S. PATENT DOCUMENTS 6,205,251 B1 * 3/2001 Hsieh ........................ G06T 3/40
                                                      382/233
9,338,346 B2 * 5/2016 Takeuchi ........... H04N 5/23212
(Continued)

FOREIGN PATENT DOCUMENTS

JP  2008-113070 A   5/2008
WO  WO-2016060366 A1 *  4/2016 ........... H04N 5/2327

*Primary Examiner* — Chiawei Chen
(74) *Attorney, Agent, or Firm* — Cowan, Liebowitz & Latman, P.C.

(57) ABSTRACT

A solid-state image sensor is provided with a pixel array including a measuring pixel and an imaging pixel, a compression circuit that applies compression processing to a signal obtained by the measuring pixel, and an output circuit that outputs the signal obtained by the measuring pixel and a signal obtained by the imaging pixel. The solid-state image sensor is configured to operate in a first mode in which a signal that is obtained by the measuring pixel and then applied the compression processing is output, and in a second mode in which a signal that is obtained by the imaging pixel and then not applied the compression processing is output.

10 Claims, 13 Drawing Sheets

(51) Int. Cl.
   *H01L 27/146*   (2006.01)
   *H04N 5/232*    (2006.01)
   *H04N 5/378*    (2011.01)
   *H04N 5/343*    (2011.01)

(56) References Cited

U.S. PATENT DOCUMENTS

| | | | |
|---|---|---|---|
| 9,721,609 B2* | 8/2017 | Kobuse | G11B 20/00007 |
| 2002/0149366 A1* | 10/2002 | Asano | G01R 33/561 |
| | | | 324/307 |
| 2004/0150724 A1* | 8/2004 | Nozaki | H04N 1/00347 |
| | | | 348/211.4 |
| 2013/0293753 A1* | 11/2013 | Keelan | H04N 5/3745 |
| | | | 348/302 |
| 2015/0043826 A1* | 2/2015 | Ishimitsu | G06T 7/70 |
| | | | 382/190 |
| 2015/0078725 A1* | 3/2015 | Kobuse | G11B 20/00007 |
| | | | 386/224 |
| 2016/0006925 A1* | 1/2016 | Yamada | H04N 5/359 |
| | | | 348/703 |
| 2016/0301853 A1* | 10/2016 | Takeuchi | H04N 5/23212 |
| 2016/0360136 A1* | 12/2016 | Katagawa | H04N 19/174 |
| 2018/0131884 A1* | 5/2018 | Nishikawa | H04N 5/2355 |
| 2019/0068909 A1* | 2/2019 | Kaibara | G01S 11/12 |

* cited by examiner

LIGHT IRRADIATION SURFACE

SOLID-STATE IMAGE SENSOR, IMAGE CAPTURE APPARATUS AND IMAGE CAPTURE METHOD

BACKGROUND OF THE INVENTION

Field of the Invention

The present invention relates to a solid-state image sensor, an image capture apparatus and an image capture method.

Description of the Related Art

The number of pixels of solid-state image sensors that are provided in image capture apparatuses such as digital cameras is on an upward trend. The data amount of image data increases with an increase in the number of pixels, thus contributing to a drop in the readout speed of image data. In view of this, it has been proposed to suppress the drop in readout speed, by reducing the data amount of image data through compression processing within the solid-state image sensor. On the other hand, Japanese Patent Laid-Open No. 2008-113070 discloses preventing degradation of image quality, by not performing compression and decompression operations, in the case where imaging sensitivity is high in an image capture apparatus having a signal processing unit that performs lossy compression and decompression of RAW image data externally to the image sensor.

However, a technology that realizes both a reduction in the data amount and suppression of a drop in image quality in a solid-state image sensor having a function of compressing image data has not been proposed.

SUMMARY OF THE INVENTION

According to the present invention, it becomes possible to realize both a reduction in the data amount and suppression of a drop in image quality in a solid-state image sensor having a function of compressing image data. Also, according to the present invention, an image capture apparatus and an image capture method that use a solid-state image sensor capable of realizing both a reduction in the data amount and suppression of a drop in image quality are provided.

According to an aspect of the present invention, there is provided a solid-state image sensor comprising: a pixel array including a measuring pixel and an imaging pixel; a compression circuit that applies compression processing to a signal obtained by the measuring pixel; and an output circuit that outputs the signal obtained by the measuring pixel and a signal obtained by the imaging pixel, wherein the solid-state image sensor is configured to operate in a first mode in which a signal that is obtained by the measuring pixel and then applied the compression processing by the compression circuit is output via the output circuit, and in a second mode in which a signal that is obtained by the imaging pixel and then not applied the compression processing by the compression circuit is output via the output circuit.

According to an aspect of the present invention, there is provided an image capture apparatus comprising: a solid-state image sensor that includes a pixel array including a measuring pixel and an imaging pixel, a compression circuit that applies compression processing to a signal obtained by the measuring pixel, and an output circuit that outputs the signal obtained by the measuring pixel and a signal obtained by the imaging pixel, wherein the solid-state image sensor is configured to operate in a first mode in which a signal that is obtained by the measuring pixel and then applied the compression processing by the compression circuit is output via the output circuit, and in a second mode in which a signal obtained by the imaging pixel and then not applied the compression processing by the compression circuit is output via the output circuit; and a signal processor that decodes a signal to which the compression processing has been applied by the compression circuit.

According to an aspect of the present invention, there is provided an image capture method comprising: outputting a signal that is obtained by a measuring pixel included in a pixel array and then applied compression processing; and outputting a signal that is obtained by an imaging pixel included in the pixel array and then not applied the compression processing.

Further features of the present invention will become apparent from the following description of exemplary embodiments with reference to the attached drawings.

DESCRIPTION OF THE EMBODIMENTS

Exemplary embodiments of the present invention will now be described in detail in accordance with the accompanying drawings. Note that the present invention is not limited to the following embodiments, and changes can be made as appropriate. Also, the embodiments shown below may be combined as appropriate.

First Embodiment

A solid-state image sensor according to a first embodiment, a control method therefor, and an image capture apparatus will be described using FIGS. 1 to 8.

Figure 3A:
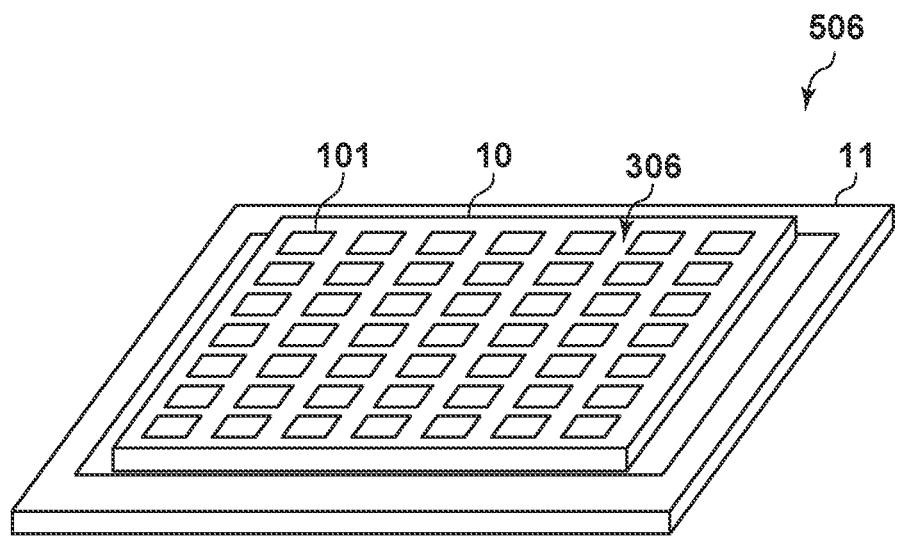
FIGS. 3A and 3B are a perspective view and a cross-sectional view showing the solid-state image sensor according to the first embodiment.

FIG. 3A is a perspective view showing the solid-state image sensor according to the present embodiment. As shown in FIG. 3A, a solid-state image sensor 506 according to the present embodiment has a first semiconductor chip (first semiconductor substrate) 10 and a second semiconductor chip (second semiconductor substrate) 11. The solid-state image sensor 506 is a stacked-type image sensor in which the first semiconductor chip 10 is stacked on the second semiconductor chip 11. The first semiconductor chip 10 has a pixel array 306 in which a plurality of pixels (pixel portions) 101 are arrayed two dimensionally, that is, in a matrix.

The pixel array 306 includes measuring pixels and imaging pixels. Optical black pixels which are pixels that are located in a light-shielded area and ranging pixels which are pixels that are used in ranging are given as examples of measuring pixels. The ranging pixels may be pixels whose output can be used to generate image signals for use in ranging employing a phase difference detection method, for example. Also, the ranging pixels may be pixels used exclusively for ranging, or may also be utilized as imaging pixels.

The first semiconductor chip 10 is disposed on the side of the second semiconductor chip 11 on which light is incident. That is, the first semiconductor chip 10 is located on the side of the second semiconductor chip 11 on which the optical image is received. A pixel drive circuit (readout circuit, readout unit) that includes column scanning circuits 113a and 113b (see FIG. 1) and a row scanning circuit 112 (see FIG. 1), which will be discussed later, is formed on the second semiconductor chip 11.

A memory 117 (frame memory) and a compression processing unit 118 are also formed on the second semiconductor chip 11. In the present embodiment, since the first semiconductor chip 10 on which the pixels 101 are formed and the second semiconductor chip 11 on which peripheral circuits are formed are separate, the manufacturing process of the pixels 101 and the manufacturing process of the peripheral circuits are separated. Thus, in the present embodiment, improvements such as thinner and higher density wiring are realized in the peripheral circuits and the like, and improvements such as increased speed, compactness and functionality of the solid-state image sensor 506 are realized.

Figure 3B:
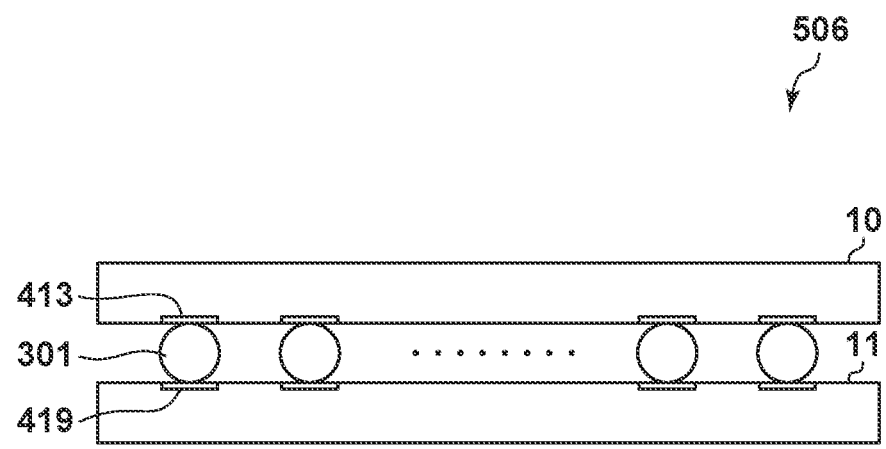

FIG. 3B is a cross-sectional view showing the solid-state image sensor according to the present embodiment. As shown in FIG. 3B, electrode pads (micro pads) 413 and 419 are respectively formed on the first semiconductor chip 10 and the second semiconductor chip 11. The electrode pad 413 formed on the first semiconductor chip 10 and the electrode pad 419 formed on the second semiconductor chip 11 are electrically connected by a bump (micro bump) 301 or the like. The bump 301 is formed by solder, for example.

Figure 1:
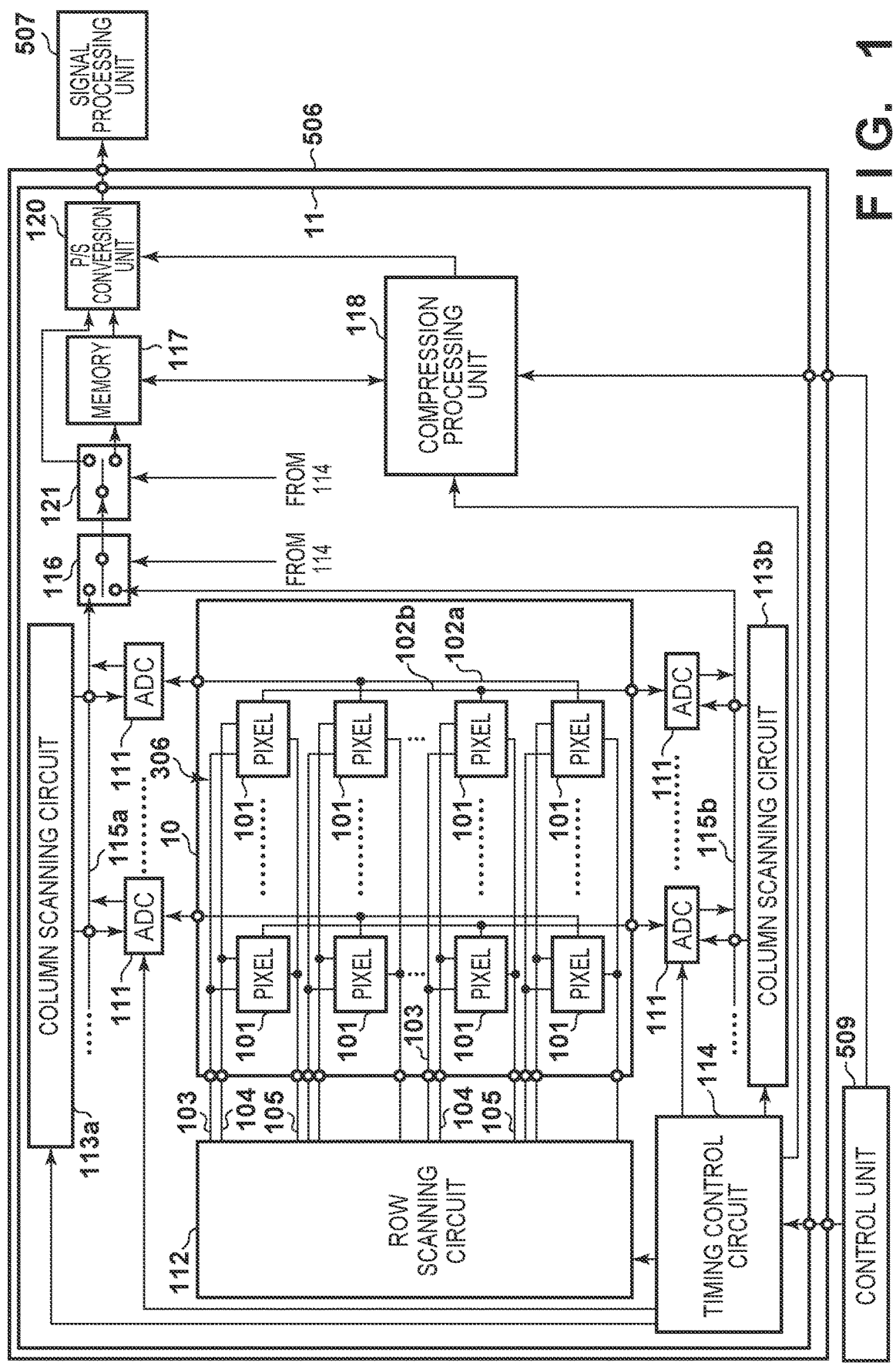
FIG. 1 is a block diagram showing a solid-state image sensor according to a first embodiment.

FIG. 1 is a block diagram showing the solid-state image sensor according to the present embodiment. The solid-state image sensor 506 according to the present embodiment has the first semiconductor chip 10 which functions as an image capture layer and the second semiconductor chip 11 which functions as a circuit layer.

The pixel array 306 having a plurality of pixels 101 arrayed in a two-dimensional matrix is formed on the first semiconductor chip 10. Also, one of a red (R), a green (Gr, Gb) and a blue (B) color filter is provided on each pixel in accordance with a primary color Bayer array.

The pixels 101 are each connected to a transfer signal line 103, a reset signal line 104 and a row selection signal line 105 in the horizontal direction (line direction), and are each connected to a column signal output line 102a or a column signal output line 102b in the vertical direction (column direction). Note that the pixels 101 to which the column signal output line 102a or 102b are connected differ depending on the signal readout row.

The second semiconductor chip 11 is provided with a column ADC block 111. The column ADC block 111 is connected to the column signal output line 102a or the column signal output line 102b. Furthermore, the second semiconductor chip 11 is provided with the row scanning circuit 112 that scans the pixels of each row, and the column scanning circuits 113a and 113b that scan the pixels of each column.

Furthermore, the second semiconductor chip 11 is provided with a timing control circuit 114 that respectively controls the operation timing of the row scanning circuit 112, the column scanning circuits 113a and 113b, the column ADC blocks 111 and changeover switches 116 and 121, based on control signals from a control unit 509. The timing control circuit 114 has a nonvolatile memory that stores the position and type of measuring pixels, and is used in control of the switch 121 and the like.

Furthermore, the second semiconductor chip 11 is provided with horizontal signal output lines 115a and 115b that transmit signals received from the column ADC blocks 111, in accordance with timing that is controlled by the column scanning circuits 113a and 113b. The second semiconductor chip 11 is further provided with the changeover switches 116 and 121, the memory 117, the compression processing unit 118, and a parallel-to-serial conversion unit (P/S conversion unit) 120. Pixel signals (image signals, image data) that are obtained by the solid-state image sensor 506 are output to the signal processing unit 507. The solid-state image sensor 506 is controlled by the control unit 509.

In the present embodiment, since the first semiconductor chip 10 on which the pixels 101 are formed and the second semiconductor chip 11 on which the peripheral circuits are formed are separate, the manufacturing process of the pixels 101 and the manufacturing process of the peripheral circuits are separated. Thus, in the present embodiment, improvements such as thinner and higher density wiring are realized in the peripheral circuits and the like, and improvements such as increased speed, compactness and functionality of the solid-state image sensor 506 are realized.

The changeover switch 116 selectively outputs pixel signals that are output via the horizontal signal output line 115a and pixel signals that are output via the horizontal signal output line 115b. The changeover switch 116 is controlled by the timing control circuit 114, for example.

The changeover switch 121 outputs image data that is output from the changeover switch 116 to the memory 117 or the P/S conversion unit 120. The changeover switch 121 is controlled by the timing control circuit 114, for example.

The memory 117 is a frame memory that temporarily stores pixel signals (image data) that are supplied via the changeover switch 121.

The compression processing unit 118 applies compression processing to the image data saved in the memory 117, under the control of the control unit 509. The compression processing is processing that reduces the data amount by encoding image data. In the present embodiment, lossy encoding of image data is performed, in order to enhance encoding efficiency (data compression ratio). In the case where compression processing is unnecessary, the changeover switch 121 is connected to the P/S conversion unit 120, and image data that is supplied from the changeover switch 116 is supplied directly to the P/S conversion unit 120 without being stored in the memory 117.

The P/S conversion unit 120 performs parallel-to-serial conversion on image data that is input from the switch 121 or the memory 117. The serial image data that is output from the P/S conversion unit 120 is transmitted from the solid-state image sensor 506 to the signal processing unit 507.

Figure 10:
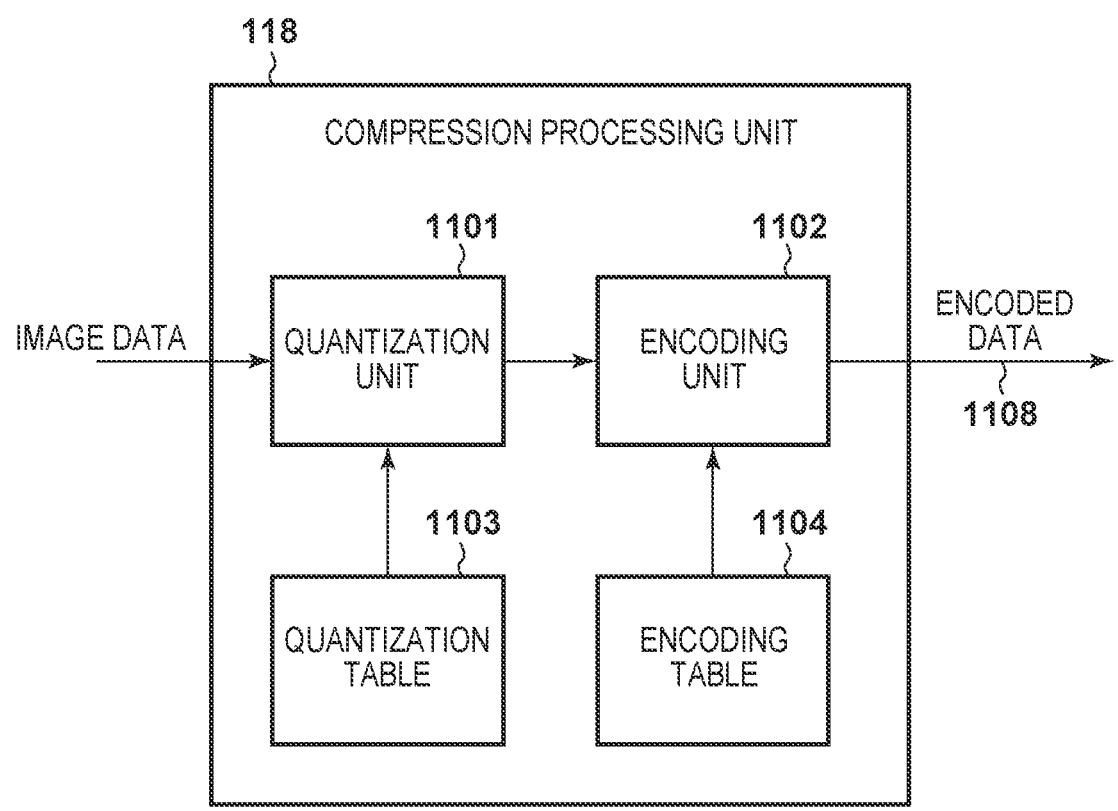
FIG. 10 is a block diagram showing an exemplary functional configuration of a compression processing unit according to an embodiment.

Here, an example of the configuration and operations of the compression processing unit 118 will be described. FIG. 10 is a block diagram showing an exemplary functional configuration of the compression processing unit 118. The compression processing unit 118 is provided with a quantization unit 1101, an encoding unit 1102, a quantization table 1103, and an encoding table 1104. The quantization unit 1101 is a circuit that derives the difference value of pixel data and quantizes the difference value with reference to the quantization table 1104. The compression processing unit 118 can be implemented using an FPGA or the like that is provided on the second semiconductor chip 11, for example. The quantization unit 1101 is able to quantize the difference value between pixels that are adjacent in the scan direction, for example, but may quantize the difference value derived with another method.

The quantization table 1103 is a table storing a quantization step that is used when quantizing the difference value of pixel data. The quantization step may be a fixed value or may be a value that depends on the size of the difference value.

The encoding table 1104 is a table for implementing entropy encoding that allocates a sign with fewer bits as the frequency of appearance of the data increases. The encoding unit 1102 is able to implement Huffman encoding with reference to the encoding table 1104, for example, after binarizing the quantization value and converting the resultant value into run length notation, for example. Furthermore, the encoding unit 1102 outputs encoded data 1108 for every pixel. The encoding unit 1102 includes information required in decoding encoded data 1108, such as information specifying the quantization table, in the header information of the encoded data 1108. The signal processing unit 507 can decode encoded data based on the header information of the encoded data.

Figure 11:
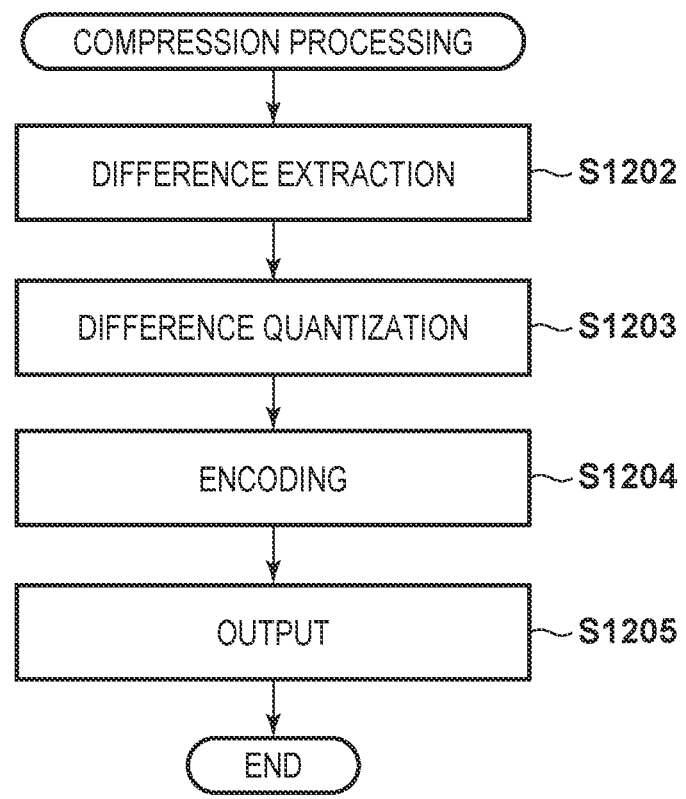
FIG. 11 is a flowchart showing operations of a compression processing unit according to an embodiment.

FIG. 11 is a flowchart relating to the compression processing by the compression processing unit 118. Here, RAW image data to be encoded is assumed to be already stored in the memory 117.

When compression processing is started, the quantization unit 1101, in step S1202, obtains RAW image data of a predetermined encoding block size from the memory 117. Note that, as will be discussed later, not all of the image data that is read out is necessarily stored in the memory 117. The quantization unit 1101 then calculates the difference value between adjacent pixels for the obtained RAW image data. Note that in the case where the encoding block spans a plurality of rows, the difference value between adjacent pixels can be calculated, assuming that the pixels are arranged in raster scan order which proceeds horizontally from the pixel on the left edge of the uppermost row and, upon reaching the right edge, proceeds horizontally from the left edge of the next row.

Next, in step S1203, the quantization unit 1101 quantizes the difference value calculated in step S1202, using a quantization step that is based on the quantization table 1103. The quantization step may be a fixed value independent of the difference value or may be a value that depends on the difference value. The quantization unit 1101 outputs the quantized difference value (quantized value) to the encoding unit 1102.

Next, in step S1204, the encoding unit 1102 encodes the quantized value. As described above, the encoding unit 1102 implements entropy encoding with reference to the encoding table 1104, after converting the quantized value into a binary number, for example. Also, the encoding unit 1102 includes information (encoding parameters) required in decoding in the header information of the encoded data.

In step S1205, the encoding unit 1102 outputs the encoded data to the P/S conversion unit 120 in response to an instruction from the timing control circuit 114. The compression processing unit 118 repeatedly executes the above processing for every encoding block. The size of the encoding blocks can be defined in advance according to the image data to be encoded.

Next, the decoding processing in the signal processing unit 507 will be described in detail. The signal processing unit 507 obtains the encoding parameters from the header information of the encoded data that is output from the image sensor 506. The signal processing unit 507 then decodes the encoded data based on the obtained encoding parameters.

Note that the methods of encoding and decoding described here are merely examples of methods implementing lossy encoding of image data. For example, a well-known suitable encoding method is applicable, such as applying quantization that enlarges the quantification step of the high frequency component and implementing entropy encoding, after applying an orthogonal transform such as DCT for every encoding block to convert the blocks into coefficients for every frequency component.

Figure 2:
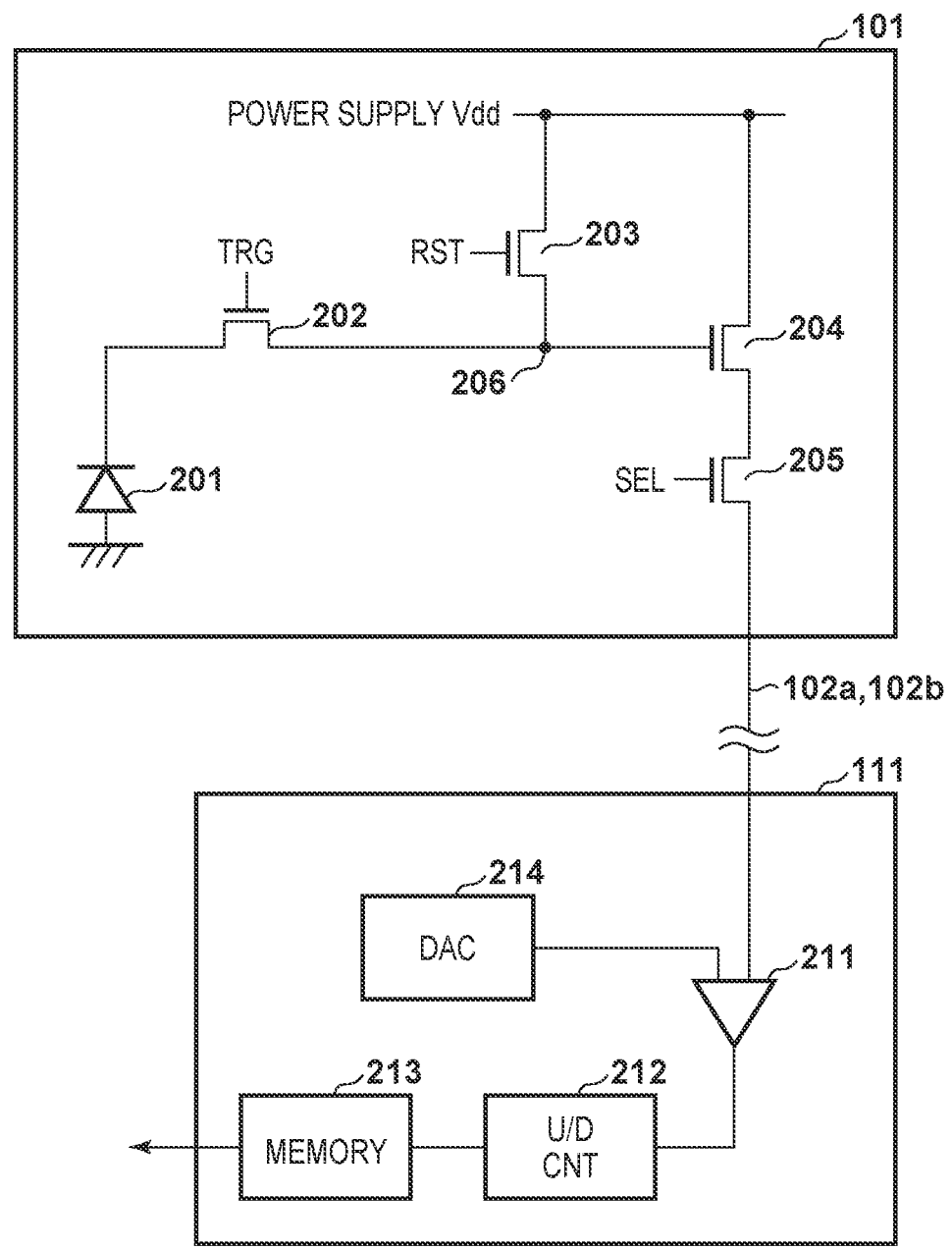
FIG. 2 is a circuit diagram showing part of the solid-state image sensor according to the first embodiment.

FIG. 2 is a circuit diagram showing part of the solid-state image sensor according to the present embodiment. The upper side of FIG. 2 shows a pixel 101, and the lower side of FIG. 2 shows a column ADC block 111.

As shown in FIG. 2, the pixel 101 has a photodiode 201 which is a photoelectric conversion device, a transfer transistor 202, a reset transistor 203, an amplification transistor 204, a selection transistor 205, and a floating diffusion 206. An N-channel MOSFET (MOS Field-Effect Transistor), for example, is used as the transistors 202 to 205.

The transfer signal line 103 which supplies a transfer signal TRG is connected to the gate of the transfer transistor 202. The reset signal line 104 which supplies a reset signal RST is connected to the gate of the reset transistor 203. The row selection signal line 105 which supplies a row selection signal SEL is connected to the gate of the selection transistor 205. These signal lines 103 to 105 extend horizontally, and the pixels 101 located in the same row are driven at the same time. Operation of a rolling shutter in which rows are exposed sequentially or a global shutter in which all rows are exposed at the same time can thereby be realized. Furthermore, the column signal output line 102a or the column signal output line 102b is connected to the source of the selection transistor 205.

The photodiode 201 generates electric charge by photoelectric conversion. The anode side of the photodiode 201 is grounded and the cathode side of the photodiode 201 is connected to the source of the transfer transistor 202. When the transfer transistor 202 switches to an ON state, the electric charge of the photodiode 201 is transferred to the floating diffusion 206. Since parasitic capacitance exists in the floating diffusion 206, electric charge transferred from the photodiode 201 is accumulated in the floating diffusion 206.

A power supply voltage Vdd is supplied to the drain of the amplification transistor 204, and the gate of the amplification transistor 204 is connected to the floating diffusion 206.

The potential of the gate of the amplification transistor 204 depends on the electric charge accumulated in the floating diffusion 206.

The selection transistor 205 is for selecting pixels 101 from which signals are to be read out, and the drain of the selection transistor 205 is connected to the source of the amplification transistor 204. Also, the source of the selection transistor 205 is connected to the column signal output line 102a or the column signal output line 102b.

When the selection transistor 205 switches to an ON state, an output signal that depends on the potential of the gate of the amplification transistor 204 is output to the column signal output line 102a or the column signal output line 102b. The power supply voltage Vdd is supplied to the drain of the reset transistor 203, and the source of the reset transistor 203 is connected to the floating diffusion 206. As a result of the reset transistor 203 switching to an ON state, the potential of the floating diffusion 206 is reset to the power supply voltage Vdd.

Note that although the case where the amplification transistor 204 is located between the selection transistor 205 and the power supply voltage Vdd is described here as an example, the selection transistor 205 may be positioned between the power supply voltage Vdd and the amplification transistor 204. Also, although the case where the pixel 101 is provided with the four transistors 202 to 205 is described here as an example, the present invention is not limited thereto, and the amplification transistor 204 and the selection transistor 205 may double as transfer and reset transistors.

The pixel signals that are output from the pixels 101 via the column signal output lines 102a and 102b are transferred to the column ADC blocks 111. The column ADC blocks 111 are each provided with a comparator 211, an up/down counter 212, a memory 213, and a DAC (digital-to-analog converter) 214.

The comparator 211 has a pair of input terminals. The column signal output lines 102a and 102b are connected to one of the input terminals of the comparator 211. The DAC 214 is connected to the other input terminal of the comparator 211. The DAC 214 outputs a lamp signal whose signal level changes in a lamp-shaped manner over time, based on a reference signal that is supplied from the timing control circuit 114.

The comparator 211 compares the level of the lamp signal that is supplied from the DAC 214 with the level of the pixel signals that are supplied from the column signal output lines 102a and 102b. The timing control circuit 114 supplies the reference signal to the DAC 214, based on control signals that are supplied from the control unit 509.

The comparator 211 outputs a high level signal, in the case where the level of the pixel signal is lower than the level of the lamp signal. On the other hand, the comparator 211 outputs a low level signal, in the case where the level of the pixel signal is higher than the level of the lamp signal. The signal that is output from the comparator 211 is supplied to the up/down counter 212.

The up/down counter 212 counts the period in which the signal that is supplied from the comparator 211 is high level or the period in which the signal that is supplied from the comparator 211 is low level. As a result of the count processing that is performed by the up/down counter 212, the pixel signals that are output from the pixels 101 are converted into digital signals. Note that an AND circuit may be provided between the comparator 211 and the up/down counter 212, a pulse signal may be supplied to the AND circuit, and the number of pulse signals may be counted by the up/down counter 212.

The signal that is output from the up/down counter 212 is supplied to the memory 213. The count value counted by the up/down counter 212 is stored in the memory 213. Note that a configuration may be adopted in which a first count value corresponding to the reset level is obtained based on the pixel signal when the pixel 101 is reset, and a second count value that is based on the pixel signal after a predetermined image capture time has elapsed is obtained. The difference value between the first count value and the second count value may then be stored in the memory 213. The pixel signals stored in the memory 213 are transferred to the horizontal signal output lines 115a and 115b in synchronicity with the signals that are supplied from the column scanning circuits 113a and 113b.

Figure 4:
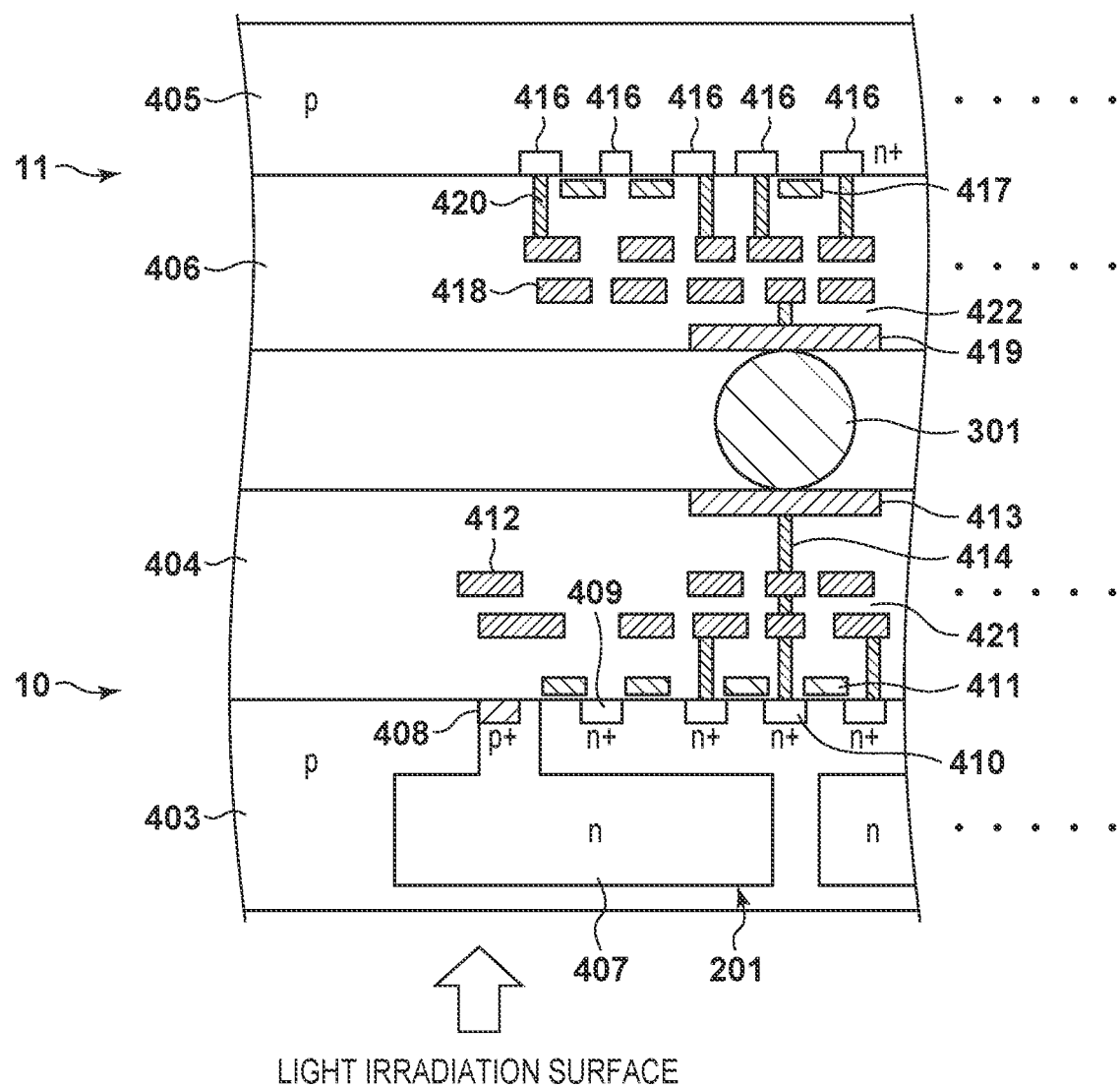
FIG. 4 is a cross-sectional view showing the solid-state image sensor according to the first embodiment.

FIG. 4 is a cross-sectional view showing the solid-state image sensor according to the present embodiment. The lower side in FIG. 4 is the light irradiation surface on which the optical image is incident. As shown in FIG. 4, the first semiconductor chip (image capture layer) 10 has a p-type silicon substrate 403, for example. The second semiconductor chip (circuit layer) 11 has a p-type silicon substrate 405, for example.

An n-type diffusion region 407 is formed within the silicon substrate 403 of the first semiconductor chip 10. A p+ type diffusion region 408 is formed in a surface part (surface on opposite side to light incident surface) of the silicon substrate 403. The photodiode 201 is constituted by the n-type diffusion region 407 and the p+ type diffusion region 408.

A gate wiring (gate electrode) 411 is formed on the silicon substrate 403 via a gate insulation film. The gate wiring 411 constitutes a gate electrode of the transfer transistor 202, the reset transistor 203, the amplification transistor 204 and the selection transistor 205. An n+ type diffusion region 409 constituting the floating diffusion 206 and an n+ type diffusion region 410 constituting the source/drain of the transistors are formed within the silicon substrate 403 on both side of the gate wiring 411.

A multilayer interconnect structure 404 that includes an interlayer insulation film 421 and a wiring 412, for example, is formed on the silicon substrate 403 on which the gate wiring 411 is formed. The interlayer insulation film 421 is formed by a silicon oxide film, for example. The electrode pad 413 is formed in a surface part of the multilayer interconnect structure 404. The electrode pad 413 is formed by copper or the like, for example. The wiring 412 and the electrode pad 413 are suitably connected via a via 414.

A gate wiring 417 is formed on the silicon substrate 405 of the second semiconductor chip 11 via a gate insulation film. An n+ type diffusion region 416 constituting the source/drain of the transistors is formed within the silicon substrate 405 on both sides of the gate wiring 417.

A multilayer interconnect structure 406 that includes an interlayer insulation film 422 and a wiring 418, for example, is formed on the silicon substrate 405 on which the gate wiring 417 is formed. The interlayer insulation film 422 is formed by a silicon oxide film, for example. The electrode pad 419 is formed on a surface part of the multilayer interconnect structure 406. The electrode pad 419 is formed by copper or the like, for example. The wiring 418 and the electrode pad 419 are suitably connected via a via 420.

The electrode pad 413 and the electrode pad 419 are electrically connected via the bump 301. Note that although the case where the electrode pad 413 and the electrode pad 419 are connected using the bump 301 is described here as an example, the electrode pad 413 and the electrode pad 419 may be directly connected without using the bump 301.

Figure 5:
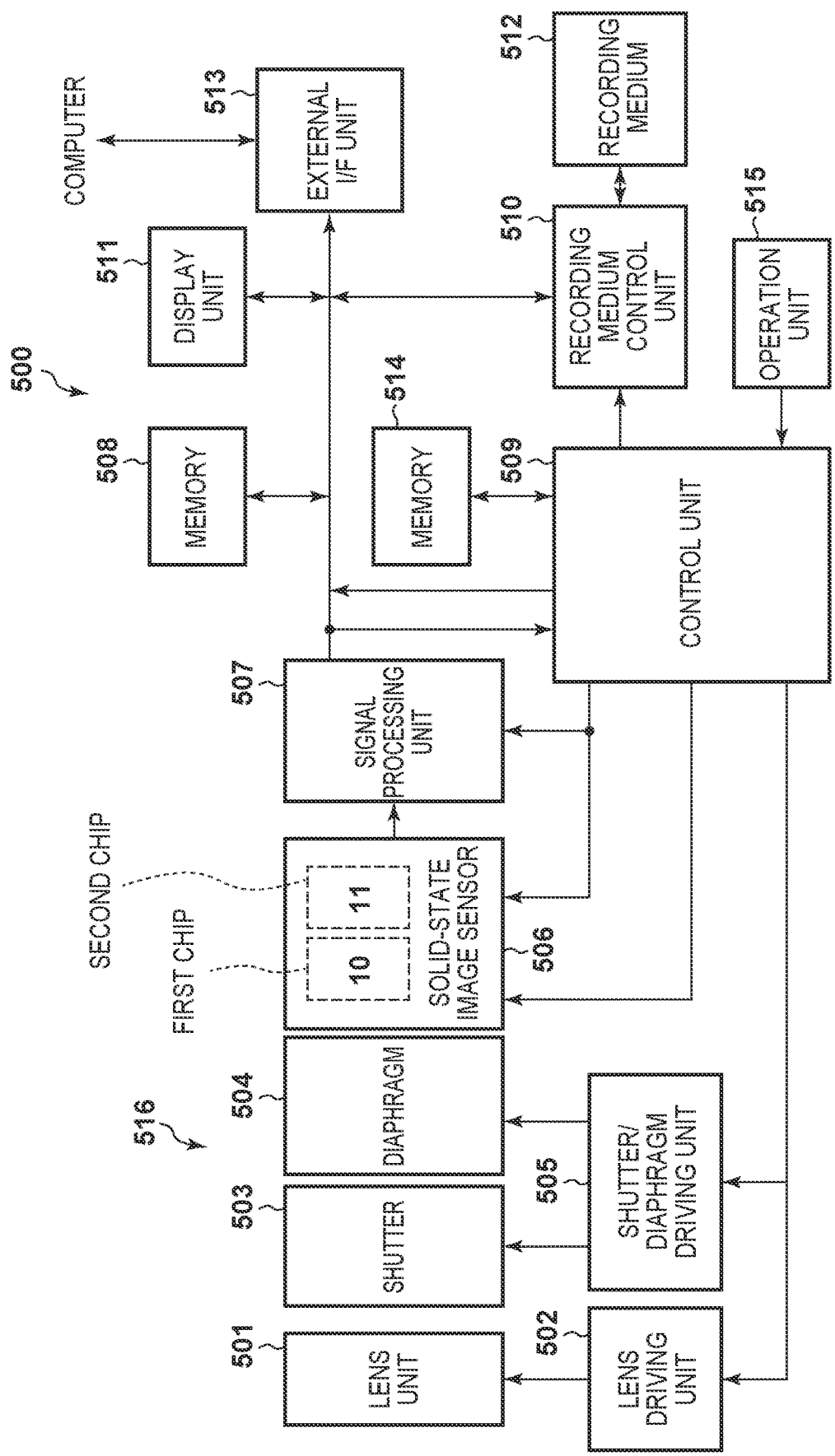
FIG. 5 is a block diagram showing an image capture apparatus according to the first embodiment.

FIG. 5 is a block diagram showing an image capture apparatus according to the present embodiment. As shown in FIG. 5, an image capture apparatus 500 is provided with an image capture optical system 516, the solid-state image sensor 506, a signal processing unit 507, memories 508 and 514, the control unit 509, an operation unit 515, a display unit 511, a recording medium control unit 510, and an external interface unit 513. Note that although the case where the image capture apparatus 500 is a digital camera is described here as an example, the image capture apparatus 500 is not limited to a digital camera.

The image capture optical system 516 is provided with a lens unit 501 for condensing light from an object to the solid-state image sensor 506. The lens unit 501 includes a focusing lens and a zoom lens. The image capture optical system 516 is further provided with a shutter (mechanical shutter) 503, a diaphragm 504, a lens driving unit (lens driving mechanism) 502, and a shutter/diaphragm driving unit 505. The image capture optical system 516 may or may not be removable from the image capture apparatus 500.

The lens driving unit 502 drives the lens unit 501, based on control signals from the control unit 509. The shutter/diaphragm driving unit 505 drives the shutter 503 and the diaphragm 504, based on control signals from the control unit 509. The image capture optical system 516 guides an optical image of the object to an imaging plane of the solid-state image sensor 506. The diaphragm 504 adjusts the amount of light that reaches the imaging plane of the solid-state image sensor 506. The shutter 503 controls the amount of time that light that reaches the imaging plane of the solid-state image sensor 506 is incident thereon.

A plurality of photoelectric conversion devices disposed two dimensionally are provided on the imaging plane of the solid-state image sensor 506. The solid-state image sensor 506 generates analog signals, by photoelectrically converting the optical image of the object using the photoelectric conversion devices. Also, the solid-state image sensor 506 performs gain adjustment on the generated analog signals, and performs A/D conversion for converting the analog signals to which gain adjustment was applied into digital signals. The solid-state image sensor 506 thus generates RAW pixel data that is constituted by pixel data of each of the colors R, Gr, Gb and B, and transmits the generated pixel data to the signal processing unit (image processing unit) 507. Here, it is assumed that at least part of the RAW image data is compressed.

The signal processing unit 507 performs various types of image processing on the RAW pixel data that is generated by the solid-state image sensor 506. Color interpolation, noise reduction, low pass filtering, shading and white balance correction are given as examples of image processing that is performed by the signal processing unit 507. The signal processing unit 507 can further perform various types of correction processing, compression processing and the like on image data. Also, the signal processing unit 507 is able to decode image data to which compression processing was applied by the compression processing unit 118.

The control unit (system control unit) 509 performs overall control of the image capture apparatus 500, and performs various computational processing. The control unit 509 is provided with a processor (hardware processor) such as a CPU (Central Processing Unit). The memory 508 is provided with a RAM (Random Access Memory) or the like. The memory 508 temporarily stores image data and the like.

The memory 514 is provided with a ROM (Read Only Memory), a RAM, or the like, for example. A program for controlling the constituent elements of the image capture apparatus 500, for example, is stored in the memory 514. As a result of the CPU executing the program stored in the memory 514, the image capture apparatus 500 is subject to overall control by the control unit 509. The memory 514 can be used as a work area of the control unit 509. Various setting information of the image capture apparatus 500 is stored in the memory 514.

The recording medium control unit 510 controls writing and reading out of image data and the like with respect to a recording medium 512. A semiconductor memory is given as an example of the recording medium 512. The recording medium 512 may or may not be removable from the image capture apparatus 500.

The display unit 511 is provided with, for example, a display device (not shown) such as a LCD (Liquid Crystal Display) and an interface (not shown) for the display device. The display unit 511 displays images that depend on the image data on a display screen of the display device. The external interface unit 513 is an input/output interface for communicating with an external device such as a computer.

The operation unit 515 includes, for example, a shutter release button, a power button, an operation button, a lever, a dial and a touch panel. Signals that depend on operations that are performed by the user on the various operation units 515 are input to the control unit 509. The control unit 509 performs control that depends on these signals on the various constituent elements of the image capture apparatus 500. A two-step pressing operation can be performed by the user on the shutter release button.

When the shutter release button is pressed halfway, image capture preparation operations such as the light measurement operation and the ranging operation are started. When the shutter release button is pressed fully, the image capture operation is started and image data that is obtained through image capture is recorded to the recording medium 512. The user can perform various settings on the image capture apparatus 500 by operating the operation button. The user is able to switch the power supply of the image capture apparatus 500 to ON or OFF by operating the power button.

Figure 6:
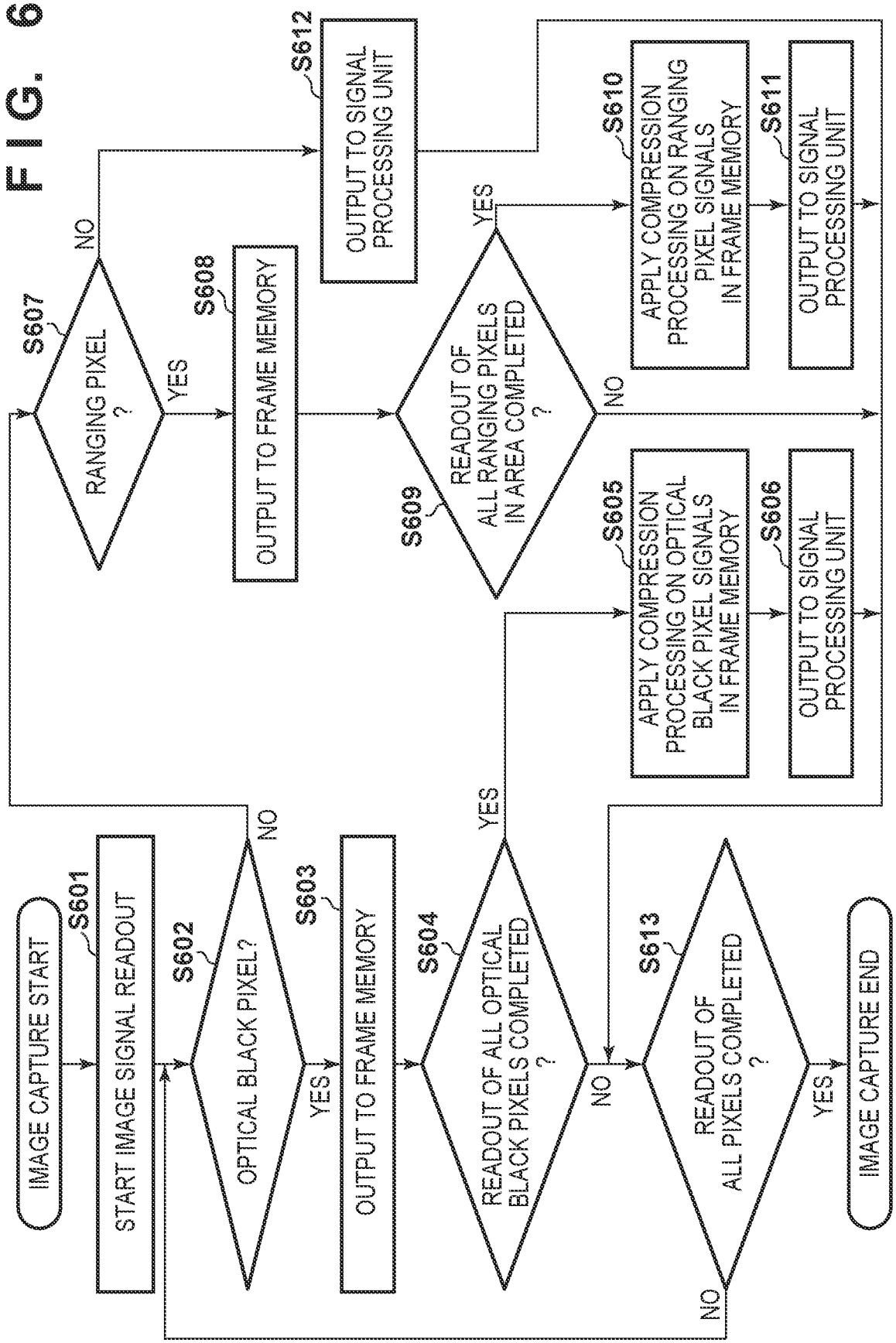
FIG. 6 is a flowchart showing operations of the image capture apparatus according to the first embodiment.

FIG. 6 is a flowchart showing operations of the image capture apparatus according to the present embodiment. When an image capture instruction is given by the user via the operation unit 515, image capture is performed by the image capture apparatus 500. When image capture is performed, readout of pixel signals is started in step S601. Thereafter, the processing transitions to step S602. Note that it is assumed that the order in which the pixel signals of the pixel array 306 are read out is set in the timing control circuit 114 by the control unit 509.

In step S602, the timing control circuit 114 determines whether the pixel whose signal is to be read out is a pixel located in a light-shielded area, that is, an optical black pixel. This determination can be performed by comparing position information of the pixel whose signal is to be read out with position information of optical black pixels stored in the nonvolatile memory that is included in the timing control circuit 114, for example.

If it is determined that the pixel whose signal is to be read out is an optical black pixel (YES in step S602), the timing control circuit 114, in step S603, connects the switch 121 to the memory 117. A signal that has been read out from the optical black pixel and undergone AD conversion, that is, optical black pixel data, is thereby stored in the memory 117. Thereafter, the processing transitions to step S604. If it is determined that the pixel whose signal is to be read out is not an optical black pixel (NO in step S602), the processing transitions to step S607.

In step S604, the timing control circuit 114 determines whether signal readout of all of the optical black pixels has been completed. If signal readout of all of the optical black pixels has not been completed (NO in step S604), the processing transitions to step S613. If signal readout of all of the optical black pixels has been completed (YES in step S604), the processing transitions to step S605.

In step S605, the compression processing unit 118 applies compression processing to the optical black pixel signals that are stored in the memory 117, and outputs the resultant signals to the P/S conversion unit 120 in response to an instruction from the timing control circuit 114. Thereafter, the processing transitions to step S606.

In step S606, the optical black pixel data to which compression processing was applied is output to the signal processing unit 507 via the P/S conversion unit 120. Thereafter, the processing transitions to step S613.

If the pixel whose signal is to be read out is not an optical black pixel (NO in step S602), the timing control circuit 114, in step S607, determines whether the pixel whose signal is to be read out is a ranging pixel. If the pixel whose signal is to be read out is a ranging pixel (YES in step S607), the timing control circuit 114, in step S608, connects the switch 121 to the memory 117. A signal that has been read out from the ranging pixel and undergone AD conversion, that is, ranging image data, is thereby stored in the memory 117. Thereafter, the processing transitions to step S609.

In step S609, the timing control circuit 114 determines whether signal readout of the ranging pixels that are located within a preset area (focus detection area) has been completed. If signal readout of the ranging pixels that are located within the area has been completed (YES in step S609), the processing transitions to step S610. If signal readout of the ranging pixels that are located within the area has not been completed (NO in step S609), the processing transitions to step S613.

In step S610, the compression processing unit 118 applies compression processing to the ranging signals stored in the memory 117, and outputs the resultant signals to the P/S conversion unit 120 in response to an instruction from the timing control circuit 114. Thereafter, the processing transitions to step S611. In step S611, the ranging image data to which compression processing was applied is output to the signal processing unit 507 via the P/S conversion unit 120. Thereafter, the processing transitions to step S613.

If the pixel whose signal is to be read out is not a ranging pixel (NO in step S607), the pixel is a pixel for use in image capture, that is, an imaging pixel. In this case, in step S612, the timing control circuit 114 connects the switch 121 to the P/S conversion unit 120. Image data obtained by AD converting the signal read out from the imaging pixel is output to the signal processing unit 507 via the P/S conversion unit 120, without being stored in the memory 117. Thereafter, the processing transitions to step S613.

In step S613, the timing control circuit 114 is determined whether signal readout of all of the pixels 110 provided in the pixel array 306 has been completed. If signal readout of all of the pixels 110 provided in the pixel array 306 has not been completed (NO in step S613), the processing returns to step S602, and similar operations to the above are repeated. If signal readout of all of the pixels 110 provided in the pixel array 306 has been completed (YES in step S613), the processing shown in FIG. 6 is completed.

Figure 7:
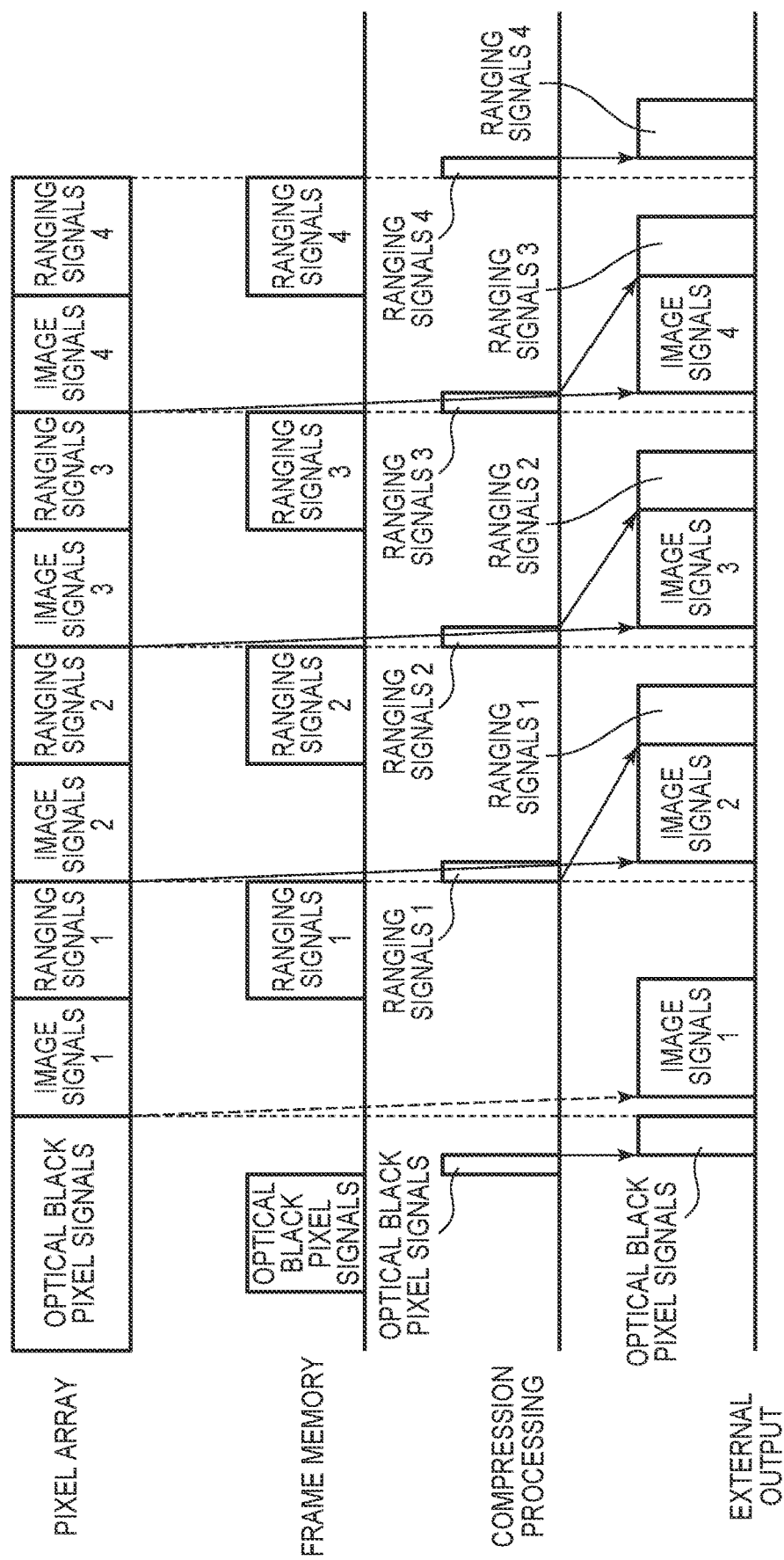
FIG. 7 is a time chart showing operations of the solid-state image sensor according to the first embodiment.

FIG. 7 is a time chart showing operations of the solid-state image sensor according to the present embodiment. At the first stage in FIG. 7, signals that are read out from the pixel array 306 are shown. As shown in FIG. 7, first, optical black pixel signals are read out and, thereafter, image signals and ranging signals are read out row by row.

Image signals 1, image signals 2, image signals 3 and image signals 4 are signals that are obtained by a plurality of imaging pixels that are respectively located in the first, second, third and fourth rows of the pixel array 306. Ranging signals 1, ranging signals 2, ranging signals 3 and ranging signals 4 are signals that are obtained by a plurality of ranging pixels that are respectively located in the first, second, third and fourth rows of the pixel array 306. Note that the readout processing from the first row to the fourth row is illustrated here, for simplification of description.

First, the optical black pixel signals are read out from the pixel array 306. Optical black pixel signals to be used as a reference level of the image signals, out of the optical black pixel signals read out from the pixel array 306, are stored in the memory 117. Thereafter, compression processing is applied to the optical black pixel signals stored in the memory 117. The optical black pixel signals to which compression processing was applied are output to outside of the solid-state image sensor 506.

After the optical black pixel signals have been read out from the pixel array 306, readout of pixel signals from the plurality of imaging pixels that are located in the first row of the pixel array 306, that is, readout of the image signals 1, is performed. The image signals 1 read out from the pixel array 306 are output to outside of the solid-state image sensor 506, without being stored in the memory 117 and also without compression processing being applied thereto.

After the pixel signals have been read out from the plurality of imaging pixels that are located in the first row of the pixel array 306, readout of the pixel signals from the ranging pixels that are located in the first row of the pixel array 306 is performed. That is, readout of the ranging signals 1 is performed. The ranging signals 1 read out from the pixel array 306 are stored in the memory 117. Compression processing is then performed on the ranging signals 1 stored in the memory 117. The ranging signals 1 to which compression processing was applied are not output to outside of the solid-state image sensor 506 at this stage.

After readout of the pixel signals from the ranging pixels that are located in the first row of the pixel array 306 is performed, readout of the pixel signals from the plurality of imaging pixels that are located in the second row of the pixel array 306 is performed. That is, readout of the image signals 2 is performed. The image signals 2 read out from the pixel array 306 are output to outside of the solid-state image sensor 506, without being stored in the memory 117 and also without compression processing being applied thereto. Following the image signals 2 being output externally, the ranging signals 1 to which compression processing was applied are output externally.

After the pixel signals are read out from the plurality of imaging pixels that are located in the second row of the pixel array 306, readout of the pixel signals from the ranging pixels that are located in the second row of the pixel array 306, that is, readout of the ranging signals 2, is performed. The ranging signals 2 read out from the pixel array 306 are stored in the memory 117. Compression processing is then performed on the ranging signals 2 stored in the memory 117. The ranging signals 2 to which compression processing was applied are not output to outside of the solid-state image sensor 506 at this stage.

After readout of the pixel signals from the ranging pixels that are located in the second row of the pixel array 306 is performed, readout of the pixel signals from the plurality of imaging pixels that are located in the third row of the pixel array 306, that is, readout of the image signals 3, is performed. The image signals 3 read out from the pixel array 306 are output to outside of the solid-state image sensor 506, without being stored in the memory 117 and also without compression processing being applied thereto. Following the image signals 3 being output externally, the ranging signals 2 to which compression processing was applied are output externally. Thereafter, processing is performed similarly to the above. Readout for one frame is completed when readout on the last row is completed.

Note that, in the compression processing that is respectively performed in steps S605 and S610, the compression scheme, compression ratio and the like can be suitably set according to the type of signal to undergo compression processing. The optical black pixel signals that are obtained by the optical black pixels are used as a reference level of the image signals. Accordingly, compression processing at a high compression ratio so as to obtain the average value of a plurality of optical black pixel signals may be applied to the optical black pixel signals.

Also, the case where the pixel signals that are obtained by the ranging pixels are compressed every row is described here as an example. In the case of performing phase difference detection in the lateral direction, no particular problems arise, even when the pixel signals that are obtained by the ranging pixels are compressed every row. However, in the case of performing phase difference detection in the longitudinal direction, there is a risk that the phase difference detection will be adversely affected when the pixel signals that are obtained by the ranging pixels are compressed for every row. Accordingly, after storage of pixel signals equivalent to one frame that are obtained by the ranging pixels in the memory 117 has ended, compression processing spanning the longitudinal direction may be applied to the pixel signals.

Figure 8:
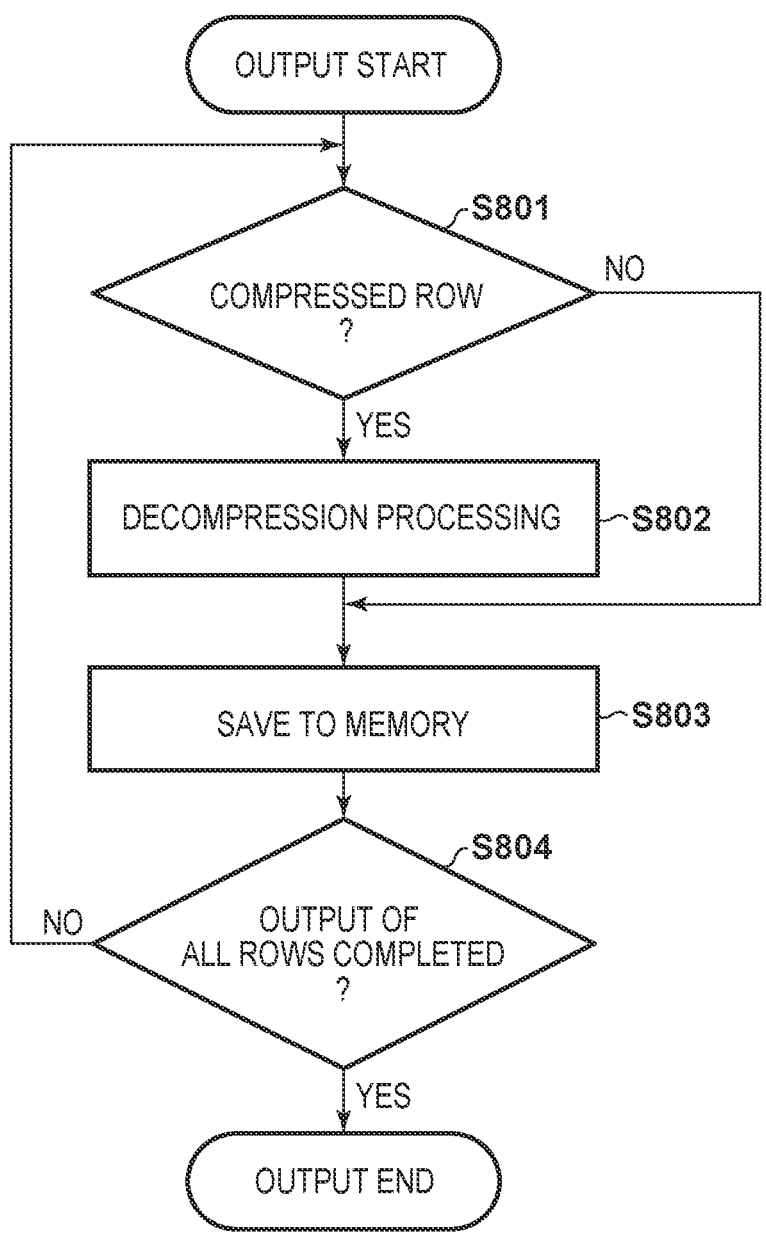
FIG. 8 is a flowchart showing an example of decompression processing that is performed in a signal processing unit provided in the image capture apparatus according to the first embodiment.

Also, decompression processing needs to be applied in the signal processing unit 507 to the data to which compression processing was applied. FIG. 8 is a flowchart showing an example of decompression processing that is performed in the signal processing unit provided in the image capture apparatus according to the present embodiment. Here, the case where there exist compressed rows, which are rows including pixel signals to which compression processing has been applied, and uncompressed rows, which are rows that do not include pixel signals to which compression processing has been applied, is described as an example. Different synchronous codes, for example, are given to compressed rows and uncompressed rows. The signal processing unit 507 can identify, based on the synchronous code, for example, whether the row that underwent readout processing is a compressed row or an uncompressed row. As mentioned above, whether or not data has undergone compression processing can also be distinguished by referring to the header information of encoded data.

When supply of pixel signals to the signal processing unit 507 via the P/S conversion unit 120 is started, the signal processing unit 507, in step S801, determines whether the pixel signals are pixel signals of a compressed row. If the pixel signals are pixel signals of a compressed row (YES in step S801), the processing transitions to step S802. In step S802, the signal processing unit 507 performs decompression processing on the pixel signals. Thereafter, the processing transitions to step S803. In step S803, the signal processing unit 507 saves the pixel signals to which decompression processing was applied in the memory 508. Thereafter, the processing transitions to step S804.

On the other hand, if the pixel signals are not the pixel signals of a compressed row (NO in step S801), the signal processing unit 507, in step S803, saves the pixel signals in the memory 508, without applying decompression processing to the pixel signals. Thereafter, the processing transitions to step S804.

In step S804, it is determined whether output of all of the rows has been completed. If output of all of the rows has not been completed (NO in step S804), the processing returns to step S801, and similar processing to the above is repeated. On the other hand, in the case where processing of all of the rows has been completed (YES in step S804), the processing shown in FIG. 8 ends.

Note that although the case where processing that is performed in the signal processing unit 507 differs between compressed rows and uncompressed rows is described here as an example, the present invention is not limited thereto. For example, the processing that is performed in the signal processing unit 507 may be changed per region or may be changed per pixel.

In this way, according to the present embodiment, the solid-state image sensor can operate in a first mode and a second mode. In the first mode, signals obtained by the optical black pixels and the ranging pixels and to which compression processing is applied by the compression processing unit 118 are output via the P/S conversion unit 120. In the second mode, signals obtained by the imaging pixels and to which compression processing is not applied by the compression processing unit 118 are output via the P/S conversion unit 120. In this way, in the present embodiment, compression processing is applied to pixel signals obtained by the optical black pixels and the ranging pixels, whereas compression processing is not applied to pixel signals obtained by the imaging pixels. Accordingly, the present embodiment enables image data to be output quickly without impairing image quality.

Second Embodiment

A solid-state image sensor, an image capture apparatus and an image capture method according to a second embodiment will be described using FIG. 9. Constituent elements that are the same as the solid-state image sensor according to the first embodiment shown in FIGS. 1 to 8 are given the same reference signs, and description thereof will be omitted or simplified.

The present embodiment relates to operations in the case where the only measuring pixels provided in the pixel array 306 of the solid-state image sensor 506 are optical black pixels, and there are no ranging pixels.

Figure 9:
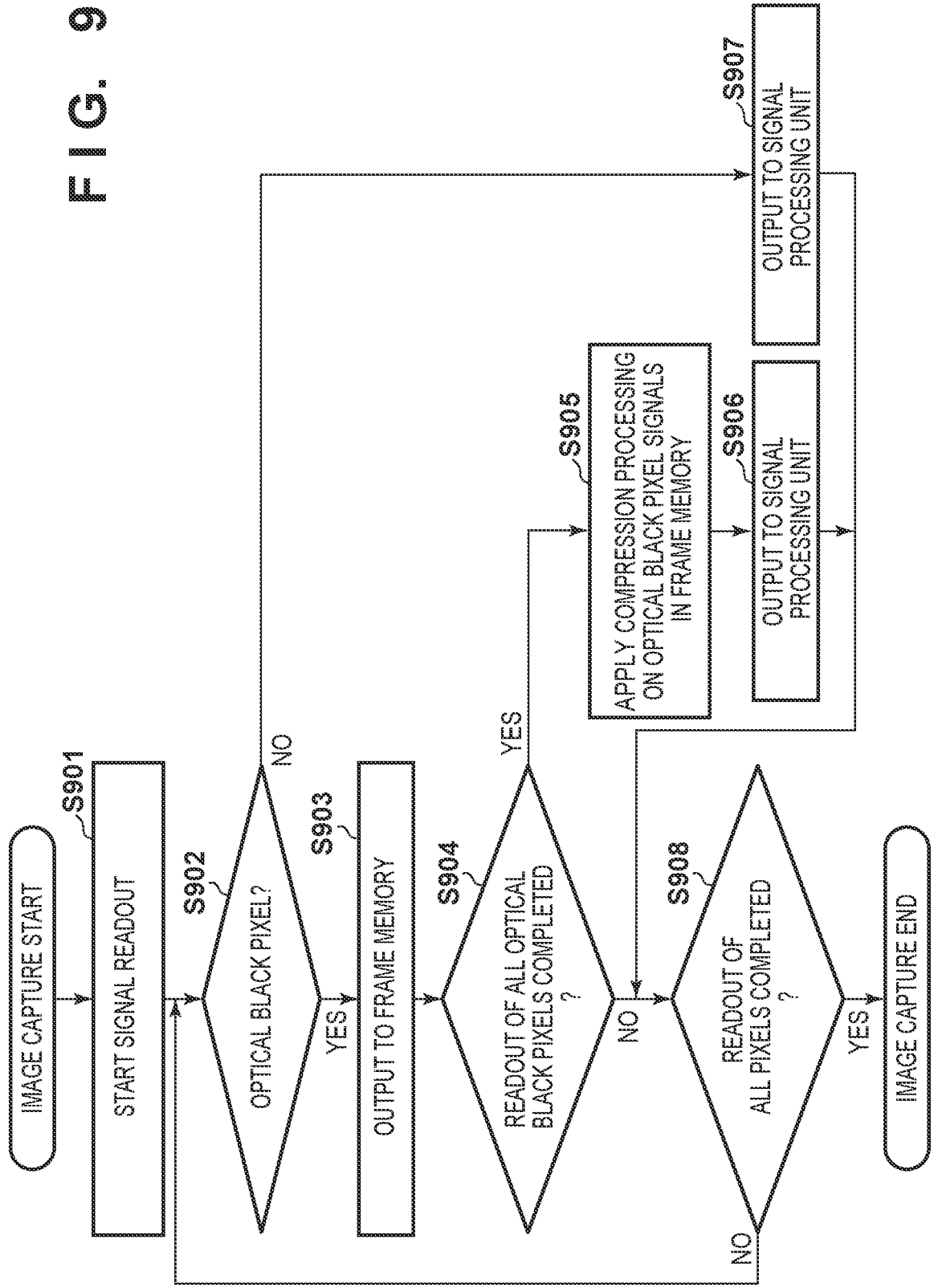
FIG. 9 is a flowchart showing operations of an image capture apparatus according to a second embodiment.

FIG. 9 is a flowchart showing operations of the image capture apparatus according to the present embodiment. In FIG. 9, the processing of steps S901 to S906 is the same as steps S601 to S606 in FIG. 6. Also, the processing of step S908 is the same as step S613 in FIG. 6, and the processing of step S907 is the same as step S612 in FIG. 6.

In this way, in the case where ranging pixels are not provided in the solid-state image sensor, a configuration need only be adopted in which the optical black pixels are compressed and the imaging pixels are not compressed. The present embodiment also enables image data to be output quickly without impairing image quality.

Third Embodiment

Figure 12:
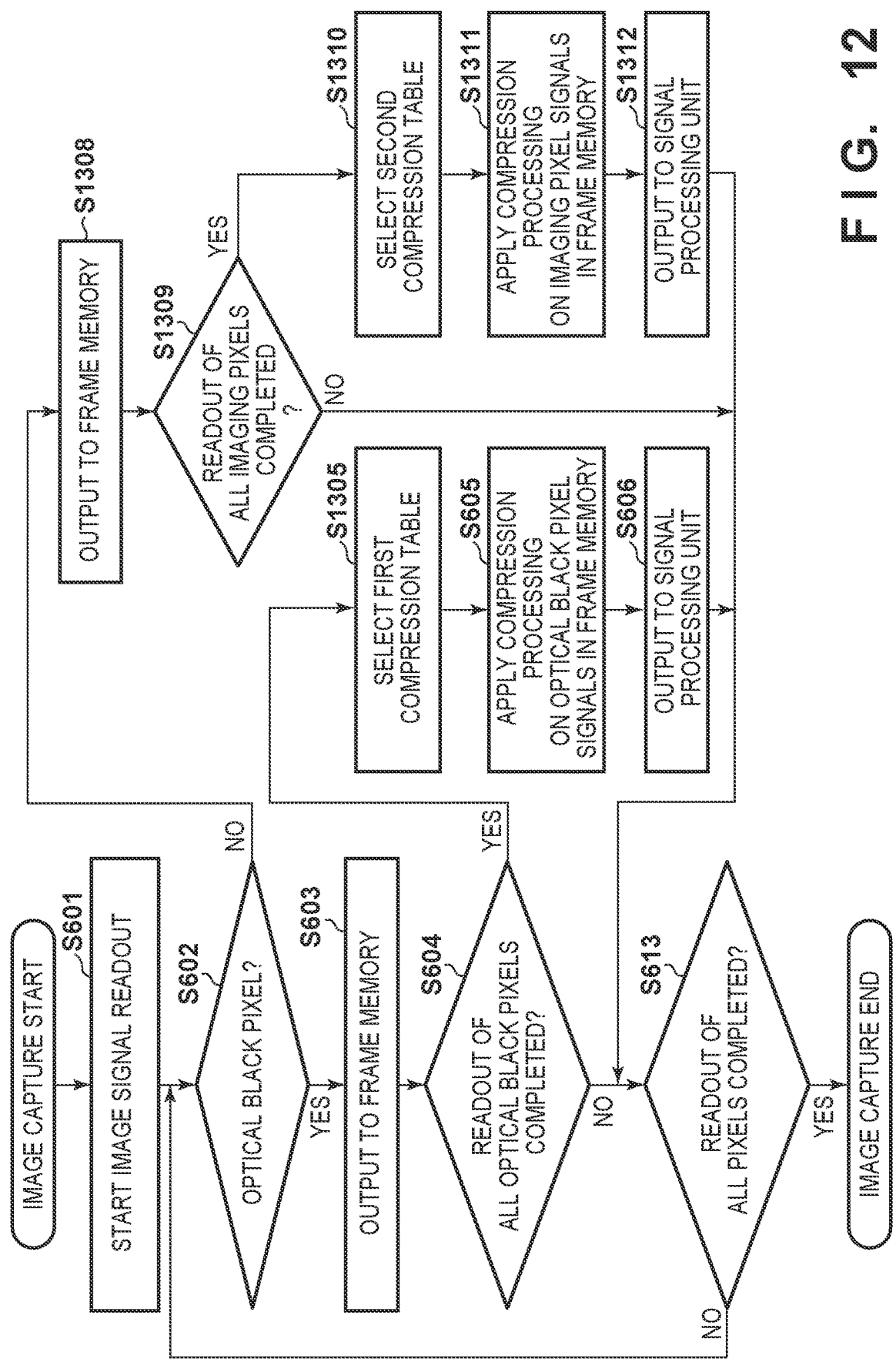
FIG. 12 is a flowchart showing operations of an image capture apparatus according to a third embodiment.

FIG. 12 is a flowchart showing operations of an image capture apparatus according to a third embodiment. Since the image capture apparatus of the present embodiment can be implemented by the configuration of FIG. 1 described in the first embodiment, only the operations of the image capture apparatus will be described below. In the present embodiment, similarly to the second embodiment, ranging pixels are not provided in the solid-state image sensor 506.

In the present embodiment, the data of the measuring pixels and the data of the imaging pixels are both compressed. Also, the compression ratio for the data of the measuring pixels is set higher than the compression ratio for the data of the imaging pixels, by preparing a plurality of quantization tables having different data compression ratios for the quantization table 1103 of the compression processing unit 118, and selectively using these tables according to the type of data to be compressed.

In FIG. 12, the same reference signs are given to steps in which the same operations as FIG. 6 are performed, and description thereof is omitted.

If it is determined in step S604 that the data of all of the optical black pixels has been read out, the compression processing unit 118, in step S1305, selects the table having a first compression ratio as the quantization table to be used in compression processing that is applied to the data of the optical black pixels that are stored in the memory 117. Here, the first compression ratio is higher than a second compression ratio, and the data reduction amount is larger.

In step S605, the compression processing unit 118 performs compression processing using the table having the first compression ratio in the quantization by the quantization unit 1101, and outputs the data of the optical black pixels after compression processing to the P/S conversion unit 120. In step S606, the P/S conversion unit 120 then outputs the data of the optical black pixels to the signal processing unit 507. Thereafter, the processing transitions to step S613.

If it is determined that the pixel whose signal is to be read out is not an optical black pixel (NO in step S602), the processing transitions to step S1308. Since there are no ranging pixels in the present embodiment, in the case of transitioning to step S1308, the pixel whose signal is to be read out is an imaging pixel. In order to also apply compression processing to the data of the imaging pixel, the timing control circuit 114, in step S1308, connects the switch 121 to the memory 117. The data of the imaging pixels is thereby also stored in the memory 117.

In step S1309, the timing control circuit 114 determines whether signal readout of all of the imaging pixels has been completed. If signal readout of all of the imaging pixels has not been completed (NO in step S1309), the processing transitions to step S613. If signal readout of all of the imaging pixels has been completed (YES in step S1309), the processing transitions to step S1310.

In step S1310, the compression processing unit 118 selects the table having the second compression ratio as the quantization table to be used in compression processing that is applied to the data of the imaging pixels that are stored in the memory 117. Here, the second compression ratio is lower than the first compression ratio, and the data reduction amount is smaller. In step S1311, the compression processing unit 118 then performs compression processing using the table having the second compression ratio in the quantization by the quantization unit 1101, and outputs the data of the imaging pixel after compression processing to the P/S conversion unit 120.

In step S1312, the P/S conversion unit 120 then outputs the data of the imaging pixels to the signal processing unit 507. Thereafter, the processing transitions to step S613.

Note that a suitable quantization step is determined through testing or the like, such that a compression ratio that depends on the type of signal to undergo compression processing can be realized with the quantization table that is selected in steps S1305 and S1310. The compression ratio may be changed by changing the method of preprocessing of data for performing quantization.

The data of the optical black pixels is used as a reference level of the data of the imaging pixels, and even when the compression ratio set higher than for the data of the imaging pixels, the effect on image quality is minimal.

Accordingly, in the present embodiment, compression processing with a higher compression ratio than for the data of the imaging pixels is applied to the data of the optical black pixels. Note that the compression ratio of image data of the same type may be changed depending on image capture conditions (e.g., imaging sensitivity, exposure time).

Fourth Embodiment

Figure 13:
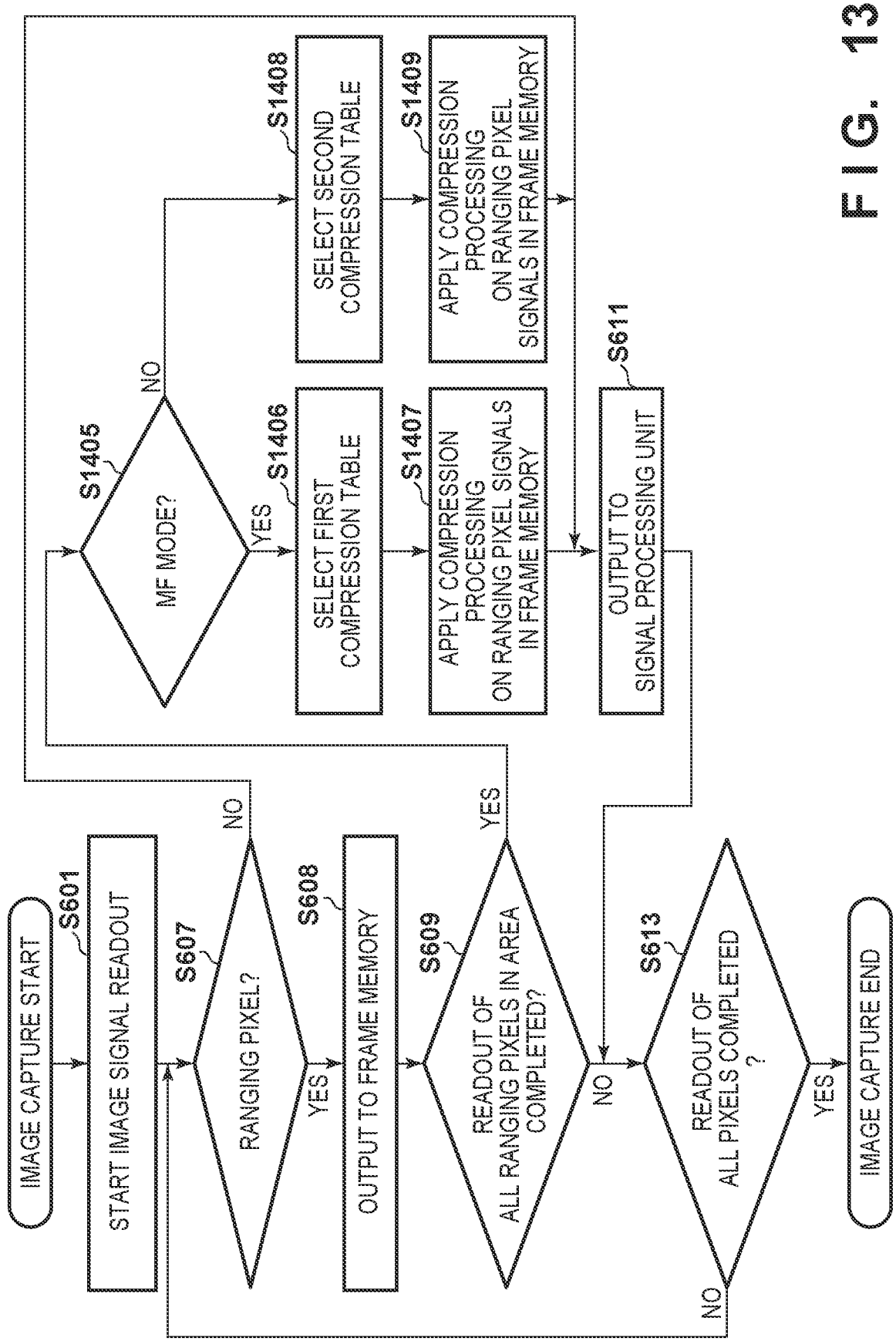
FIG. 13 is a flowchart showing operations of an image capture apparatus according to a fourth embodiment.

FIG. 13 is a flowchart showing operations of an image capture apparatus according to a fourth embodiment. Since the image capture apparatus of the present embodiment can be implemented by the configuration of FIG. 1 described in the first embodiment, only the operations of the image capture apparatus will be described below.

In the present embodiment, the data of measuring pixels is compressed, whereas compression processing is not performed on the data of imaging pixels. Also, the compression ratio of data of the same type is changed depending on the image capture mode (here, MF mode or AF mode).

In FIG. 13, the same reference signs are given to steps in which the same operations as FIG. 6 are performed, and description thereof is omitted. Note that although processing regarding the data of the optical black pixels is not shown in FIG. 13, it is assumed that the data of the optical black pixels undergoes compression processing such as described in any of the first to third embodiments.

In step S607, the pixel whose signal is to be read out is an imaging pixel in the case of not being a ranging pixel, and the processing from step S611 onward is executed, without performing compression processing.

In step S609, when it is determined that signal readout of all of the ranging pixels within the area has been completed by the timing control circuit 114, the processing transitions to step S1405.

In step S1405, the compression processing unit 118 determines whether the ranging mode of the image capture apparatus 500 is the manual focus mode (MF mode) or the autofocus mode (AF mode). If the MF mode, the processing transitions in step S1406, and if the AF mode, the processing transitions to step S1408.

In step S1406, the compression processing unit 118 selects the table having the first compression ratio as the quantization table to be used in compression processing that is applied to the data of the ranging pixels that are stored in the memory 117. Here, the first compression ratio is higher than the second compression ratio, and the data reduction amount is larger. This is due to the fact that ranging information for use in AF processing is not required in the case of the MF mode.

In step S1407, the compression processing unit 118 performs compression processing using the table having the first compression ratio in the quantization by the quantization unit 1101, and outputs the data of the ranging pixels after compression processing to the P/S conversion unit 120. In step S611, the P/S conversion unit 120 then outputs the data of the imaging pixels to the signal processing unit 507. Thereafter, the processing transitions to step S613.

On the other hand, in step S1408, the compression processing unit 118 selects the table having the second compression ratio as the quantization table to be used in compression processing that is applied to the data of the ranging pixels that are stored in the memory 117. Here, the second compression ratio is lower than the first compression ratio, and the data reduction amount is smaller. This is due to the fact that ranging information for use in AF processing is required in the case of the AF mode.

In step S1409, the compression processing unit 118 performs compression processing using the table having the second compression ratio in the quantization by the quantization unit 1101, and outputs the data of the ranging pixels after compression processing to the P/S conversion unit 120. In step S611, the P/S conversion unit 120 then outputs the data of the imaging pixels to the signal processing unit 507. Thereafter, the processing transitions to step S613.

Although the present embodiment describes an example in which the compression ratio of the data of the ranging pixels is changed depending on the ranging mode of the image capture apparatus, the compression ratio may be changed depending on image capture conditions (e.g., imaging sensitivity, exposure time).

Other Embodiments

The embodiments of the present invention are not limited to the aforementioned embodiments. The aforementioned embodiments to which changes or modifications that do not depart from the spirit of the invention have been made are also included in the embodiments of the present invention.

For example, although, in the aforementioned embodiments, the case where the image capture apparatus 500 is a digital camera was described as an example, the present invention is not limited thereto. That is, the present invention is applicable to all devices in which a solid-state image sensor is provided. For example, the image capture apparatus may be a mobile phone terminal, a portable image viewer, a television equipped with a camera, a digital photo frame, a music player, a game machine, an electronic book reader or the like.

Also, in the present invention, there is no particular restriction on combining different types of measuring pixels to undergo compression processing or different compression ratios. Also, the data of the imaging pixels can be compressed in a range in which image degradation is tolerable, and the compression ratio on the data of the imaging pixels may be higher than on the data of the measuring pixels. For example, when capturing moving image data for use in live view display, the compression ratio can be increased, since the image quality degradation of individual frames is not readily noticeable given the small display size. On the other hand, the compression ratio for the data of the ranging pixels is set lower than the compression ratio on moving image frames, in order to suppress degradation of AF accuracy.

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2017-167625, filed on Aug. 31, 2017, and No. 2018-134480, filed on Jul. 17, 2018, which are hereby incorporated by reference herein in their entirety.

What is claimed is:

1. A solid-state image sensor comprising:
a pixel array in which a plurality of pixels are arranged in a matrix;
a readout circuit that readouts, from the pixel array, a phase difference detection signal for performing a phase difference detection and an imaging signal for generating an image;
a compression circuit that applies compression processing to a signal readout from the pixel array by the readout circuit; and
an output circuit that outputs the phase difference detection signal or the imaging signal readout by the readout circuit to outside the solid-state image sensor,
wherein the solid-state image sensor is configured to operate in a first mode in which the phase difference detection signal that has undergone the compression processing by the compression circuit is output via the output circuit, and in a second mode in which the imaging signal that has not undergone the compression processing by the compression circuit is output via the output circuit.

2. The solid-state image sensor according to claim 1, wherein the phase difference detection signal is obtained by a measuring pixel in the pixel array.

3. The solid-state image sensor according to claim 1,
wherein the pixel array is formed on a first semiconductor chip,
the compression circuit and the output circuit are formed on a second semiconductor chip that is different from the first semiconductor chip, and
the first semiconductor chip and the second semiconductor chip are stacked.

4. The solid-state image sensor according to claim 1, wherein the compression circuit applies, to the phase difference detection signal in a case where the solid-state image sensor is operating in the first mode, the compression processing having a compression ratio that differs according to a setting of an image capture apparatus that includes the solid-state image sensor.

5. The solid-state image sensor according to claim 4, wherein the compression circuit, in a case where the image capture apparatus is set to a manual focus mode, applies, to the phase difference detection signal in a case where the solid-state image sensor is operating in the first mode, the compression processing having a compression ratio that is higher than in a case where the image capture apparatus is set to an autofocus mode.

6. A solid-state image sensor comprising:

a pixel array in which a plurality of pixels are arranged in a matrix;

a readout circuit that readouts a phase difference detection signal for performing a phase difference detection and an imaging signal for generating an image;

a compression circuit that applies compression processing to a signal readout from the pixel array by the readout circuit; and an output circuit that outputs the phase difference detection signal or the imaging signal, readout by the readout circuit to outside the solid-state image sensor, wherein the solid-state image sensor is configured to operate in a first mode in which the compression processing is applied to the phase detection signal, wherein the solid-state image sensor is configured to operate, in a first mode, the phase difference detection signal that has undergone the compression processing having a first compression ratio by the compression circuit is output via the output circuit and, in a second mode, the imaging signal that has undergone the compression processing having a second compression ratio by the compression circuit is output via the output circuit, wherein the second compression ratio is lower than the first compression ratio.

7. An image capture apparatus comprising:

a solid-state image sensor that includes a pixel array in which a plurality of pixels are arranged in a matrix; a readout circuit that readouts a phase difference detection signal for performing a phase difference detection and an imaging signal for generating an image; a compression circuit that applies compression processing to a readout from the pixel array by the readout circuit; and an output circuit that outputs the phase difference detection signal or the imaging signal, readout by the readout circuit to outside the solid-state image sensor, wherein the solid-state image sensor is configured to operate in a first mode in which the phase difference detection signal that has undergone the compression processing by the compression circuit is output via the output circuit, and in a second mode in which the imaging signal that has not undergone the compression processing by the compression circuit is output via the output circuit; and a signal processor that decodes a signal to which the compression processing has been applied by the compression circuit.

8. An image capture method performed by a solid-state image sensor, wherein the solid-state image sensor includes a pixel array in which a plurality of pixels are arranged in a matrix, the method comprising:

reading out, from the pixel array, a phase difference detection signal for performing a phase difference detection and an imaging signal for generating an image;

in a first mode, outputting the phase difference detection signal that has been compressed to outside the solid-state image sensor; and in a second mode, outputting the imaging signal that has not been compressed to outside the solid-state image sensor.

9. An image capture apparatus comprising:

a solid-state image sensor that includes a pixel array in which a plurality of pixels are arranged in a matrix; a readout circuit that readouts a phase difference detection signal for performing a phase difference detection and an imaging signal for generating an image; a compression circuit that applies compression processing to a signal readout from the pixel array by the readout circuit; and an output circuit that outputs the phase difference detection signal or the imaging signal, readout by the readout circuit to outside the solid-state image sensor, wherein the solid-state image sensor is configured to operate in a first mode in which the phase difference detection signal that has undergone the compression processing having a first compression ratio by the compression circuit is output via the output circuit, and in a second mode in which the imaging signal that has undergone the compression processing having a second compression ratio by the compression circuit is output via the output circuit, wherein the second compression ratio is lower than the first compression ratio; and a signal processor that decodes a signal to which the compression processing has been applied by the compression circuit.

10. An image capture method performed by a solid-state image sensor, wherein the solid-state image sensor includes a pixel array in which a plurality of pixels are arranged in a matrix, the method comprising:

reading out, from the pixel array, a phase difference detection signal for performing a phase difference detection and an imaging signal for generating an image;

in a first mode, outputting the phase difference detection signal that has been compressed with a first compression ratio to outside the solid-state image sensor; and in a second mode, outputting the imaging signal that has been compressed with a second compression ratio to outside the solid-state image sensor wherein the second compression ratio is lower than the first compression ratio.

* * * * *